(12) United States Patent
Yamamura

(10) Patent No.: US 7,151,687 B2
(45) Date of Patent: Dec. 19, 2006

(54) FERROELECTRIC MEMORY DEVICE, ELECTRONIC APPARATUS AND DRIVING METHOD

(75) Inventor: Mitsuhiro Yamamura, Suwa (JP)

(73) Assignee: Seiko Epson Corporation (JP)

( * ) Notice: Subject to any disclaimer, the term of this patent is extended or adjusted under 35 U.S.C. 154(b) by 57 days.

(21) Appl. No.: 11/022,371

(22) Filed: Dec. 23, 2004

(65) Prior Publication Data

US 2005/0157532 A1 Jul. 21, 2005

(30) Foreign Application Priority Data

Dec. 25, 2003 (JP) ............................. 2003-430679

(51) Int. Cl.
*G11C 11/22* (2006.01)

(52) U.S. Cl. ................. 365/145; 365/149; 365/189.01; 365/189.05

(58) Field of Classification Search ................ 365/145, 365/149, 189.01, 189.05
See application file for complete search history.

(56) References Cited

U.S. PATENT DOCUMENTS

| | | | |
|---|---|---|---|
| 4,873,664 A | 10/1989 | Eaton | |
| 5,675,530 A * | 10/1997 | Hirano et al. | 365/145 |
| 6,118,688 A * | 9/2000 | Hirano et al. | 365/145 |
| 6,147,895 A * | 11/2000 | Kamp | 365/145 |
| 6,587,366 B1 * | 7/2003 | Tanaka | 365/145 |
| 6,741,489 B1 * | 5/2004 | Takasu et al. | 365/145 |
| 6,987,687 B1 * | 1/2006 | Ashikaga | 365/145 |
| 2005/0162889 A1 * | 7/2005 | Yamamura | 365/145 |

FOREIGN PATENT DOCUMENTS

JP 63-201998 8/1988

\* cited by examiner

*Primary Examiner*—Richard Elms
*Assistant Examiner*—Toan Le
(74) *Attorney, Agent, or Firm*—Harness, Dickey & Pierce, P.L.C.

(57) ABSTRACT

A ferroelectric memory device that is equipped with a cell array provided with a plurality of memory cells each having a first ferroelectric capacitor and a second ferroelectric capacitor that are connected to each other in series, a memory cell selection section that selects a specified one of the plurality of memory cells, a potential difference generation section that gives a potential difference across one end and another end of the selected memory cell, and a judging section that judges memory data stored in the memory cell based on a potential at a connection node between the first ferroelectric capacitor and the second ferroelectric capacitor when the potential difference is given to the memory cell.

11 Claims, 3 Drawing Sheets

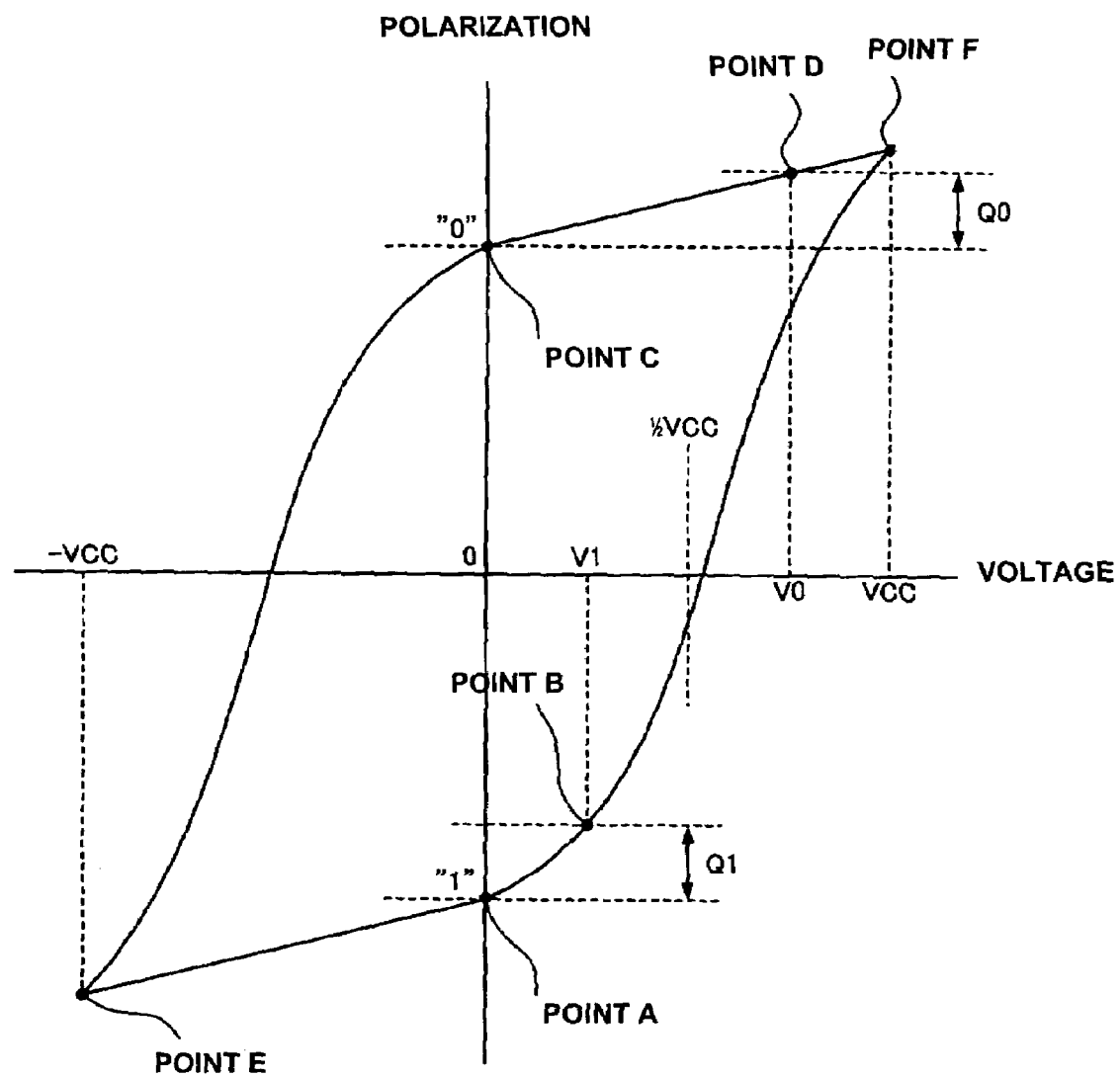

FERROELECTRIC MEMORY DEVICE, ELECTRONIC APPARATUS AND DRIVING METHOD

RELATED APPLICATIONS

This application claims priority to Japanese Patent Application No. 2003-430679 filed Dec. 25, 2003 which is hereby expressly incorporated by reference herein in its entirety.

BACKGROUND

1. Technical Field

The present invention relates to ferroelectric memory devices, electronic apparatuses, and driving methods. In particular the present invention relates to ferroelectric memory devices that can readily and stably read memory data, electronic apparatuses equipped with the ferroelectric memory devices, and their driving methods.

2. Related Art

A conventional ferroelectric memory is disclosed in Japanese Laid-open Patent Application SHO 63-201998 (Patent Document 1). The ferroelectric memory disclosed in the aforementioned Patent Document 1 is equipped with a memory cell having a pair of ferroelectric capacitors that store complementary data, a pair of bit lines connected to the pair of ferroelectric capacitors, and a sense amplifier that responds to a inter-line potential difference between the pair of bit lines.

However, in the conventional ferroelectric memory described in the aforementioned Patent Document 1, because an operational amplifier is used as the sense amplifier, there is a problem in that the structure of the ferroelectric memory is complex.

Accordingly, it is an object of the present invention to provide ferroelectric memory devices, electronic apparatuses, and driving methods which can solve the problems described above. This object can be achieved by combining the characteristics set forth in the independent claims in the scope of patent claims. Also, the dependent claims further define advantageous concrete examples of the present invention.

SUMMARY

To achieve the object described above, in accordance with a first embodiment of the present invention, there is provided a ferroelectric memory device characterized in comprising: a cell array provided with a plurality of memory cells each having a first ferroelectric capacitor and a second ferroelectric capacitor that are connected to each other in series; a memory cell selection section that selects a specified one of the plurality of memory cells; a potential difference generation section that gives a potential difference across one end and another end of the selected memory cell; and a judging section that judges memory data stored in the memory cell based on a potential at a connection node between the first ferroelectric capacitor and the second ferroelectric capacitor when the potential difference is given to the memory cell. The judging section may preferably judge the memory data by comparing a potential in a middle of the potential difference and a potential at the connection node.

With the structure described above, depending on values of the memory data stored in the memory cell, the potential at the connection node, when the potential difference generation section gives a potential difference across the two ends of the memory cell, greatly changes. Accordingly, with the structure described above, by a very simple structure of judging a potential at the connection node, memory data stored in the memory cell can be very stably judged.

The ferroelectric memory device may preferably be further equipped with a first data line that electrically connects the potential difference generation section and the one end of the memory cell, a second data line that electrically connects the potential difference generation section and the other end of the memory cell, a bit line that electrically connects the judging section and the connection node, and a charge section that charges the first data line, the second data line, and the bit line to a specified potential.

With the structure described above, the first data line, the second data line and the bit line BL can be pre-charged or discharged. Also, with the structure described above, the both ends of the ferroelectric capacitors can be brought to generally the same potential. Accordingly, a potential difference between the both ends of the ferroelectric capacitors can be reduced or brought to generally zero, such that static imprint of the ferroelectric capacitors can be suppressed.

The memory cell selection section may preferably include a first switch that is provided between the potential difference generation section and the one end of the memory cell, a second switch that is provided between the potential difference generation section and the other end of the memory cell, a third switch that is provided between the judging section and the connection node, and a word line that is electrically connected to the first switch, the second switch and the third switch, to control the first switch, the second switch and the third switch.

The judging section may preferably have an inverter that receives the potential at the connection node as an input. With the structure described above, memory data can be stably judged, with a very simple structure.

The ferroelectric memory device may preferably be further equipped with a writing section that re-stores the memory data in the memory cell, by controlling the potentials on the both ends of the memory cell and the connection node, based on the memory data judged by the judging section.

With the structure described above, when the judging section judges memory data stored in the memory cell, even if the memory data is destroyed, data that is identical with the memory data can be stored in the memory cell again. In other words, with the structure described above, the memory data is always stored in the memory cell. Accordingly, even when the power supply that is fed to the ferroelectric memory device is cut off, the data remains to be stored in the memory cell, such that the memory data can be re-supplied from the ferroelectric memory device to outside after feeding of the power supply starts again. Accordingly, with the structure described above, there can be provided a ferroelectric memory device whose operation is stable.

The writing section may preferably have a first inverter that receives the potential at the connection node as an input, and supplies an output to both ends of the memory cell, and a second inverter that inverts the output of the first inverter, and supplies the output to the input of the first inverter.

With the structure described above, potentials on the two ends of the memory cell become to be generally the same potential as the potential on the output of the first inverter. Also, the potential at the connection node becomes to be generally the same potential as the potential on the input of the first inverter, in other words, on the output of the second inverter. Accordingly, with the structure described above, a potential difference can be provided between the two ends of the memory cell and the connection node, and memory data stored in the memory cell can be re-stored with a very simple structure.

The writing section may preferably be further equipped with a switch provided between the first inverter and the both ends of the memory cell.

With the structure described above, the output of the first inverter can be electrically cut off from the two ends of the memory cell. Accordingly, with the structure described above, potentials on the two ends of the memory cell can be brought to a potential different from that on the output of the first inverter, such that a memory data judgment operation and re-storage operation can both be achieved.

The ferroelectric memory device may preferably be further equipped with a latch circuit that latches the memory data that is judged by the judging section.

With the structure described above, because memory data that has been judged by the judging section can be latched, the ferroelectric memory device can supply the memory data to outside even after the judging section has judged the memory data.

In accordance with a second embodiment of the present invention, there is provided an electronic apparatus characterized in comprising the ferroelectric memory device recited above. It is noted here that the electronic apparatus generally refers to an apparatus equipped with a ferroelectric memory device in accordance with the present invention, which achieves predetermined functions, and is not particularly limited in its structure, but may include all devices that require storage devices, such as, for example, computer devices in general, portable telephones, PHSs, PDAs, electronic notebooks, IC cards, and the like, which are equipped with the semiconductor device described above.

In accordance with a third embodiment of the present invention, there is provided a driving method for driving a ferroelectric memory device having a plurality of memory cells each having a first ferroelectric capacitor and a second ferroelectric capacitor that are connected to each other in series, the driving method characterized in comprising; a step of selecting a specified one of the plurality of memory cells; a step of giving a potential difference across one end and another end of the selected memory cell; and a step of judging memory data stored in the memory cell based on a potential at a connection node between the first ferroelectric capacitor and the second ferroelectric capacitor when the potential difference is given to the memory cell.

Also, the driving method may preferably be further equipped with a step of re-storing the memory data in the memory cell, by controlling the potentials on the both ends of the memory cell and the connection node, based on the memory data judged by the judging section.

BRIEF DESCRIPTION OF THE DRAWINGS

FIG. 3 is a diagram indicating hysteresis characteristics of a first ferroelectric capacitor 112 and a second ferroelectric capacitor 114.

DETAILED DESCRIPTION

The present invention is described below based on embodiments of the present invention with reference to the accompanying drawings. However, the embodiments described below do not limit the invention concerning the scope of patent claims, and all the combinations of the characteristics described in the embodiments would not necessarily be indispensable as the means for solution of the invention.

Figure 1:
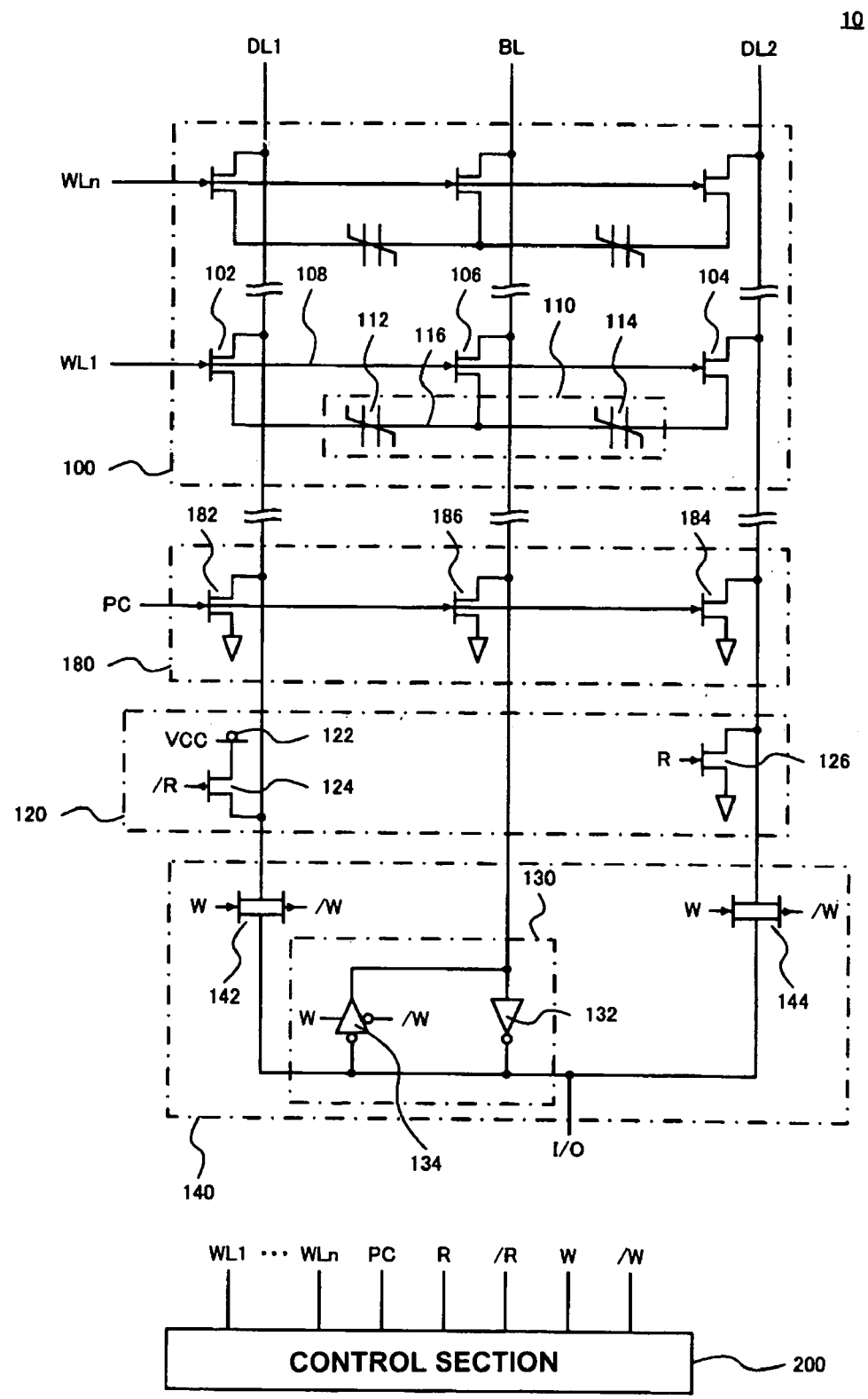
FIG. 1 is a circuit diagram showing a structure of a ferroelectric memory device 10 in accordance with an embodiment of the present invention.

FIG. 1 is a circuit diagram showing a structure of a ferroelectric memory device 10 in accordance with a first embodiment of the present invention. The ferroelectric memory device 10 has a structure equipped with a cell array 100 provided with a plurality of memory cells 110, a first data line DL1 and a second data line DL2, a bit line BL, a potential difference generation section 120, a latch section 130, a writing section 140, a charge section 180, an input/output terminal I/O, and a control section 200.

The memory cell 110 is formed from a plurality of ferroelectric capacitors that are connected in series. In the present embodiment, the memory cell 110 is formed from a first ferroelectric capacitor 112 and a second ferroelectric capacitor 114. Each of the first ferroelectric capacitor 112 and the second ferroelectric capacitor 114 has one end and another end, and the other end of the first ferroelectric capacitor 112 and the one end of the second ferroelectric capacitor 114 are electrically connected at a connection node 116. Also, the connection node 116 is electrically connected to an input of the latch section 130 through the bit line BL.

Also, the one end of the first ferroelectric capacitor 112 and the other end of the second ferroelectric capacitor 114 compose end sections of the memory cell 110. Further, the one end of the first ferroelectric capacitor 112 and the other end of the second ferroelectric capacitor 114 are electrically connected, through the first data line DL1 and the second data line DL2, respectively, to the charge section 180, the potential difference generation section 120, and an output of the latch section 130.

In the present embodiment, the cell array 10 is formed from n (n is a positive integer) memory cells 110. Also, the cell array 100 further includes n sets of an n-type MOS transistor 102 provided between one end of the memory cell 110 and the first data line DL1, an n-type MOS transistor 104 provided between the other end of the memory cell 110 and the second data line DL2, and an n-type MOS transistor 106 provided between the connection node 116 and the bit line BL.

A word line 108 is electrically connected to gates of the n-type MOS transistors 102, 104 and 106, and the n-type MOS transistors 102, 104 and 106 switch, based on a potential on the word line 108, as to whether or not the first data line DL1 and the one end of the memory cell 110, the second data line DL2 and the other end of the memory cell 110, and the bit line BL and the connection node 116 are to be electrically connected, respectively.

The potential difference generation section 120 is formed from a voltage source 122, a p-type MOS transistor 124, and an n-type MOS transistor 126, and gives a predetermined potential across the two ends of the memory cell 110. More specifically, the potential difference generation section 120 supplies a predetermined voltage to one end of the memory cell 110 through the first data line DL1, and grounds the other end of the memory cell 110 through the second data line DL2, thereby giving a potential difference of those predetermined voltages across the two ends of the memory cell 110.

The voltage source 122 generates a voltage VCC for providing a potential difference between the one end and the other end of the memory cell 110, in other words, between the one end of the first ferroelectric capacitor 112 and the other end of the second ferroelectric capacitor 114. The voltage source 122 is, for example, a voltage source that generates a driving voltage that drives the ferroelectric memory device 10. Also, although the potential difference generation section 120 in accordance with the present embodiment supplies the voltage VCC to one end of the memory cell 110, but may supply a voltage (VCC−Vth) which is a voltage reduced from the voltage VCC by a threshold voltage Vth of the MOS transistor, instead of the voltage VCC.

The p-type MOS transistor 124 has its source electrically connected to the voltage source 122, and its drain electrically connected to one end of the memory cell 110 through the first data line DL1. The p-type MOS transistor 124 switches, based on the potential on its gate, as to whether or not the voltage VCC is to be supplied to one end of the memory cell 110. Also, the n-type MOS transistor 126 has its source grounded, and its drain electrically connected to the other end of the memory cell 110 through the second data line DL2. The n-type MOS transistor 126 switches, based on the potential on its gate, as to whether or not the other end of the memory cell 110 is to be grounded. In other words, the potential difference generation section 120 controls, based on potentials (logical values) of control signals R and /R that are supplied to the gates of the p-type MOS transistor 124 and the n-type MOS transistor 126, as to whether or not the potential difference VCC is to be given across the two ends of the memory cell 110. It is noted here that each control signal including a sign/is a signal in which the logical value of the control signal without including the sign/is inverted.

The latch circuit 130 is formed from a first inverter 132 and a second inverter 134, and based on a potential on the bit line BL, judges memory data stored in the memory cell 110, and latches the memory data.

The first inverter 132 is an example of a judging section, receives a potential on the bit line BL as an input, and compares the potential on the bit line BL and an input threshold potential of the first inverter 132, thereby judging data stored in the memory cell 110. More specifically, the first inverter 132 uses an input threshold potential that is a potential between the ground potential and VCC, judges as to whether the bit line BL is higher or lower than the reference potential, and outputs a data signal indicating the judgment result (in other words, stored data). In the present embodiment, the first inverter 132 outputs, as the data signal, a signal indicating a logical L or a logical H, when the potential on the bit line BL is higher or lower than the input threshold potential, respectively. Also, in the present embodiment, the input threshold potential of the first inverter 132 is a potential that is generally half the potential difference across the two ends of the memory cell 110, in other words, a potential that is generally a half of VCC.

The second inverter 134 receives a data signal outputted from the first inverter 132, and generates an inversion data signal that is the data signal inverted. Also, the second inverter 134 has its input electrically connected to the first inverter 132, and its output electrically connected to the input of the first inverter 132 and the bit line BL, and supplies the inversion data signal to the input of the first inverter 132 and the bit line BL. By this, the first inverter 132 and the second inverter 134 compose a flip-flop, and the flip-flop latches the data signal.

Also, in the present embodiment, the second inverter 134 is a clocked gate inverter. The second inverter 134 is structured to output an inversion data signal when the logical value of the control signal W is a logical H, and provides an output of high impedance when the logical value of the control signal W is a logical L.

After the first inverter 132 that is an example of the judging section has judged memory data stored in the memory cell 110, the writing section 140 stores the memory data in the memory cell 110 again. The writing section 140 is formed from the first inverter 132, the second inverter 134, and transfer gates 142 and 144 which are an example of switches. In other words, in the present embodiment, the first inverter 132 composes a judging section, and a part of the writing section 140. Similarly, the second inverter 134 composes a part of the latch section 130, and a part of the writing section 140.

The transfer gate 142 is provided between the output of the first inverter 132 and the first data line DL1. The transfer gate 142 controls, based on potentials of the control signals W and /W supplied to its gate, as to whether or not the output of the first inverter 132 and the first data line DL1 are to be electrically connected. In other words, the transfer gate 142 controls to bring the potential on the first data line DL1 to the same potential as the potential of the output of the first inverter 132, in other words, to the potential of the data signal.

The transfer gate 144 is provided between the output of the first inverter 132 and the second data line DL2. The transfer gate 144 controls, like the transfer gate 142, based on potentials of the control signals W and /W supplied to its gate, as to whether or not the output of the first inverter 132 and the second data line DL2 are to be electrically connected.

In the present embodiment, the writing section 140 is formed from the transfer gates 142 and 144 that are an example of switches, but can be formed from n-type MOS transistors or p-type MOS transistors, instead of the transfer gates 142 and 144. In this case, a voltage VCC−Vth is supplied to the two ends of the memory cell 110, instead of the voltage VCC. It is noted here that Vth is a threshold voltage of the n-type MOS transistor or the p-type MOS transistor. Alternatively, a voltage VCC+Vth may be supplied to the gate of the n-type MOS transistor.

The charge section 180 is formed from n-type MOS transistors 182, 184 and 186, and charges the first data line DL1, the second data line DL2 and the bit line BL to a predetermined potential. The n-type MOS transistors 182, 184 and 186 each have one of their sources and drains being supplied with a predetermined voltage, and the other being electrically connected to the first data line DL1, the second data line DL2 and the bit line BL, respectively. The n-type MOS transistors 182, 184 and 186 charge, based on the potential of a control signal PC supplied to their gates, the first data line DL1, the second data line DL2 and the bit line BL to the predetermined potential.

In the present embodiment, the n-type MOS transistors 182, 184 and 186 have their sources grounded, and when the n-type MOS transistors 182, 184 and 186 become conductive, the first data line DL1, the second data line DL2 and the bit line BL are charged to a ground potential. Also, in accordance with the present embodiment, the charge section 180 operates as a pre-charge section that pre-charges the first data line DL1, the second data line DL2 and the bit line BL, and also operates as a discharge section that brings the potentials on the two ends of the memory cell 110 and the connection node 116 to generally the same potential by bringing the first data line DL1, the second data line DL2 and the bit line BL to generally the same potential.

The control section 200 generally controls operations of the ferroelectric memory device 10. In the present embodiment, the control section 200 generates control signals WL1–WLn to be supplied to respective word lines 108, a control signal PC to be supplied to the charge control section 180, control signals R and /R to be supplied to the potential difference generation section 120, and control signals W and /W to be supplied to the latch section 130 and the writing section 140, and supply them to the respective sections, thereby controlling the operations of the ferroelectric memory device 10.

The input/output terminal I/O outputs data signal generated by the first inverter 132 to outside. Also, the input/output terminal I/O makes the memory cell 110 store predetermined memory data, as described below, through receiving a signal from outside and changing the potential on the second inverter 134.

Figure 2:
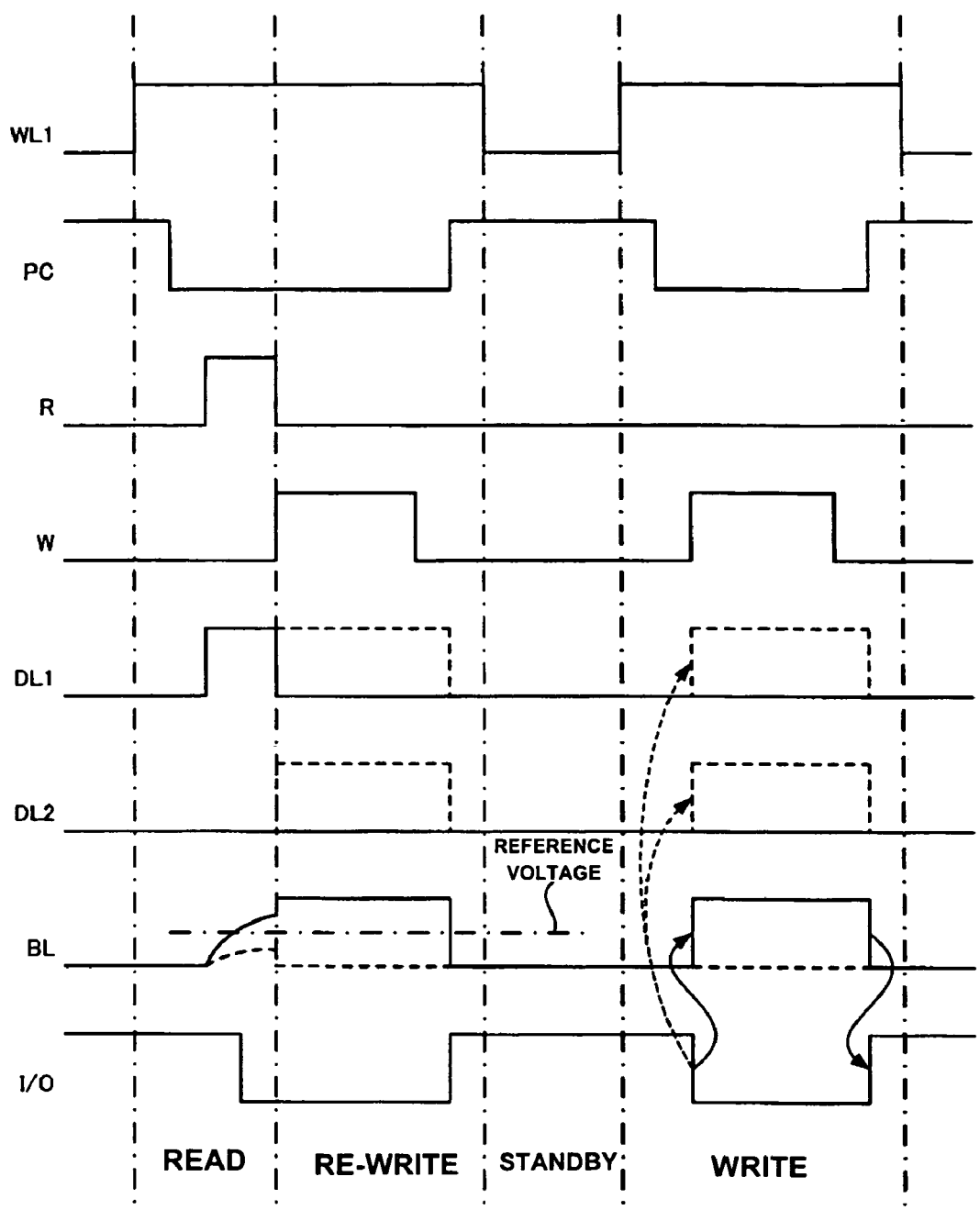
FIG. 2 is a timing chart indicating operations of the ferroelectric memory device 10.

FIG. 2 is a timing chart indicating operations of the ferroelectric memory device 10. Referring to FIG. 1 and FIG. 2, operations of the ferroelectric memory device 10 are described. In the present embodiment below, it is assumed that the first ferroelectric capacitor 112 stores "1," and the second ferroelectric capacitor 114 stores "0." In other words, the first ferroelectric capacitor 112 and the second ferroelectric capacitor 114 store complementary data. Also, in the present embodiment described below, the first ferroelectric capacitor 112 and the second ferroelectric capacitor 114 have generally the same hysteresis characteristics.

In a standby state, the control signals WL1–WLn, R and W indicate a logical L. In other words, all of the n-type MOS transistors 102, 104 and 106, the p-type MOS transistor 124, the n-type MOS transistor 126, and the transfer gates 142 and 144 are nonconductive, and the potentials on the two ends of the memory cell 110 and the connection node 116 are 0V.

Also, because the control signal PC indicates a logical H, the n-type MOS transistors 182, 184 and 186 are conductive, such that the first data line DL1, the second data line DL2 and the bit line BL are pre-charged to 0V. Accordingly, because the potential on the input of the first inverter 132 becomes to be 0V, the logical value of the data signal indicates a logical H.

Next, memory data stored in the memory cell 110 is judged. Hereunder, a read operation to read memory data stored in a specified memory cell 110, among the plurality of memory cells 110, with which a control signal WL1 is supplied, a re-write operation to re-store the memory data in the memory cell 110, and a write operation to store data that is the same as or different from the memory data in the memory cell 110, are described. It is noted that, all the descriptions below are made as to the specified memory cell 110, the first ferroelectric capacitor 112, and the second ferroelectric capacitor 114 and the connection node 116 of the memory cell 110, unless specifically noted otherwise.

First, the control section 200 changes the control signal WL1 to a logical H, while retaining the control signals WL2–WLn at a logical L, thereby making the n-type MOS transistors 102, 104 and 106 which are connected to WL1, conductive. By this, the potentials on the two ends of the memory cell 110 and the connection node 116 become to be 0V. Then, the control section 200 changes the control signal PC to a logical L, thereby bringing the first data line DL1, the second data line DL2 and the bit line BL to a floating state while keeping them at 0V. It is noted that, in the present embodiment, the potential of the logical H of the control signals WL1–WLn is Vcc+Vth or greater.

Then, the control signal 200 changes the control signal R to a logical H, thereby making both of the p-type MOS transistor 124 and the n-type MOS transistor 126 conductive. By this, a voltage VCC is supplied to the first data line DL1 and one end of the first ferroelectric capacitor 112, and the second data line DL2 and the other end of the second ferroelectric capacitor 114 are grounded. In other word, a potential difference VCC is given across the two ends of the memory cell 110. Hereunder, changes in the potential on the bit line BL when the potential difference VCC is given across the two ends of the memory cell 110 are further described with reference to FIG. 3.

FIG. 3 is a diagram indicating hysteresis characteristics of the first ferroelectric capacitor 112 and the second ferroelectric capacitor 114. In the figure, an axis of abscissas indicates voltages that are applied to both ends of the first ferroelectric capacitor 112 and/or the second ferroelectric capacitor 114, and an axis of ordinates indicates polarizations of the first ferroelectric capacitor 112 and/or the second ferroelectric capacitor 114. It is noted that, in the figure, when the potential on one end of the first ferroelectric capacitor 112 (or the second ferroelectric capacitor 114) is higher than the potential on the other end thereof, voltages along the axis of abscissas are expressed in the positive side.

In a standby state, the potentials on the two ends of the memory cell 110 and the connection node 116 are 0V, and therefore the potential difference across the both ends of the first ferroelectric capacitor 112 and the second ferroelectric capacitor 114 is generally zero, such that the hysteresis characteristic of the first ferroelectric capacitor 112 in which "1" is written is at point A, and the hysteresis characteristic of the second ferroelectric capacitor 114 in which "0" is written is at point C.

Then, when a potential difference VCC is given across the two ends of the memory cell 110, positive voltages are applied to the both ends of the first ferroelectric capacitor 112 and the second ferroelectric capacitor 114, respectively, such that the hysteresis characteristics that have been at point A and point C shift in the rightward direction in the figure. In this instance, in the present embodiment, a voltage V1 that is applied to the first ferroelectric capacitor 112, a charge amount Q1 retrieved from the first ferroelectric capacitor 112, a voltage V0 that is applied to the second ferroelectric capacitor 114, and a charge amount Q0 that is retrieved from the second ferroelectric capacitor 114 satisfy the following relation:

$Q0 = Q1$ $V0 + V1 = VCC$

Therefore, $V0 > V1$ $V0 > 1/2 VCC, V1 < 1/2 VCC$

Accordingly, in the present embodiment, when the potential difference VCC is given across the two ends of the memory cell 110, the potential on the bit line BL rises to V0 (see FIG. 2). On the other hand, in reverse of the present embodiment, when "0" is written in the first ferroelectric capacitor 112, and "1" is written in the second ferroelectric capacitor 114, and when the potential difference VCC is given across the two ends of the memory cell 110, the potential at the bit line BL rises to V1 (see dotted lines at the time of reading in FIG. 2).

Then, the first inverter 132 compares the potential on the bit line BL that has risen with the input threshold potential of the first inverter 132, thereby judging memory data stored in the memory cell 110. More specifically, in the present embodiment, the first inverter 132 has its input threshold potential set to generally half the VCC, outputs a logical L when an input potential is higher than the input threshold potential, and outputs a logical H when the input potential is lower than the input threshold potential. Accordingly, when the potential on the bit line BL rises and exceeds the input threshold potential, the output of the first inverter 132, in other words, the logical value of the data signal changes to a logical L. Then, the input/output terminal I/O outputs a logical L, as memory data that is stored in the memory cell 110.

Next, by controlling the potentials on the two ends of the memory cell 110 and at the connection node 116 based on the potential on the output of the first inverter 132, memory data is re-stored in the memory cell 110. First, after the potential on the bit line BL has risen, the control section 200 changes the control signal R to a logical L, thereby making the p-type MOS transistor 124 and the n-type MOS transistor 126 nonconductive. By this, the potential difference generation section 120 is electrically cut off from the memory cell 110.

Also, the control section 200 changes the control signal W to a logical H, thereby making the transfer gates 142 and 144 conductive. By this, the output of the first inverter 132 is electrically connected to the two ends of the memory cell 110 through the first data line DL1 and the second data line DL2. Accordingly, the potentials on one end of the first ferroelectric capacitor 112 and the other end of the second ferroelectric capacitor 114 become to be generally the same potential as the potential on the output of the first inverter 132, in other words, 0V.

In the meantime, when the control signal W changes to a logical H, the second inverter 134 outputs an inversion data signal in which the data signal outputted from the first inverter 132 is inverted. In other words, when the control signal W changes to a logical H, the output of the second inverter 134 changes from high impedance to a logical H. Accordingly, the potential on the input of the first inverter 132 and the potential on the bit line BL rise from V0 to VCC. By this, the potential on the connection node 116 also rises to VCC, such that a voltage −VCC is applied to the first ferroelectric capacitor 112, and a voltage VCC is applied to the second ferroelectric capacitor 114.

Referring to FIG. 3, as the voltage −VCC is applied to the first ferroelectric capacitor 112, the hysteresis characteristic of the first ferroelectric capacitor 112 moves from point B to point E. Also, as the voltage VCC is applied to the second ferroelectric capacitor 114, the hysteresis characteristic of the second ferroelectric capacitor 114 moves from point D to point F. Accordingly, "1" is re-written in the first ferroelectric capacitor 112, and "0" in the second ferroelectric capacitor 114. In other words, memory data that is identical with the memory data read from the memory cell 110 is re-stored in the memory cell 110. Also, at the time of re-writing, the latch section 130 keeps retaining the reading result read at the time of reading, in other words, the logical value of the output of the first inverter 132 as it is.

Next, after the memory data has been stored again in the memory cell 110, the control section 200 changes the control signal W to a logical L. By this, the two ends of the memory cell 110 are electrically cut off from the output of the first inverter 132. Also, the control section 200 changes the control signal PC to a logical L. By this, the charge section 180 charges the first data line DL1, the second data line DL2 and the bit line BL to 0V, such that the potentials on the two ends of the memory cell 110 and the connection node 116 become to be 0V. Also, when the potential on the bit line BL becomes to be 0V, as this potential is lower than the input threshold potential of the first inverter 132, the output of the first inverter 132 changes to a logical H. Then, the control section 200 changes the control signal WL1 to a logical L, thereby bringing the ferroelectric memory device 10 to the standby state described above.

In reverse of the present embodiment, when "0" is written in the first ferroelectric capacitor 112, and "1" is written in the second ferroelectric capacitor 114, and when the control signal W changes to a logical H, the potentials on the two ends of the memory cell 110 become to be VCC, and the potential on the bit line BL lowers from V1 to 0V (see dotted lines at the time of re-writing in FIG. 2). When the potential on the bit line BL lowers to 0V, the potentials on the first data line DL1 and the second data line DL2 rise to VCC. By this, a voltage VCC is applied to the first ferroelectric capacitor 112, and a voltage −VCC is applied to the second ferroelectric capacitor 114, such that "0" is re-written in the first ferroelectric capacitor 112, and "1" in the second ferroelectric capacitor 114. In other words, memory data that is identical with the memory data read from the memory cell 110 is re-stored in the memory cell 110. Then, as the control section 200 changes the control signal PC to a logical L, the potentials on the first data line DL1, the second data line DL2 and the bit line BL become to be 0V.

Next, operations to store desired memory data in the memory cell 110 are described. First, the control section 200 changes the control signal WL1 corresponding to one of the memory cells 110 to store memory data to a logical H, thereby selecting the memory cell 110. Then, the control section 200 changes the control signal PC to a logical L, thereby bringing the first data line DL1, the second data line DL2 and the bit line BL to a floating state while keeping them at 0V.

Next, as the control section 200 changes the control signal W to a logical H, the transfer gates 142 and 144 become conductive, whereby the potential on the input/output terminal I/O is changed to a logical L from outside in a state in which the memory cell 110 is electrically connected to the output of the first inverter 132. By this, a voltage applied to the first ferroelectric capacitor 112 is fixed at −VCC, and a voltage applied to the second ferroelectric capacitor 114 is fixed at VCC, such that "1" is written in the first ferroelectric capacitor 112, and "0" in the second ferroelectric capacitor 114.

On the other hand, when the input/output terminal I/O is retained at a logical H, or the potential on the input/output terminal I/O is changed to a logical H from outside, a voltage applied to the first ferroelectric capacitor 112 is fixed at VCC, and a voltage applied to the second ferroelectric capacitor 114 is fixed at −VCC, such that "0" is written in the first ferroelectric capacitor 112, and "1" in the second ferroelectric capacitor 114 (see dotted lines at the time of writing in FIG. 2). By this, desired memory data can be stored in the memory cell 110.

The embodiment examples and application examples described above with reference to the embodiments of the present invention may be appropriately combined depending on the usages, or may be used with changes and/or improvements added thereto. The present invention is not limited to the descriptions of the embodiments above. It is clear from the description in the scope of patent claims that modes created by such combinations, changes and/or improvements can be included in the technical scope of the present invention.

What is claimed is:

1. A ferroelectric memory device characterized in comprising:

a cell array provided with a plurality of memory cells each having a first ferroelectric capacitor and a second ferroelectric capacitor that are connected to each other in series;

a memory cell selection section that selects a specified one of the plurality of memory cells;

a potential difference generation section that gives a potential difference across one end and another end of the memory cell;

a judging section that judges memory data stored in the memory cell based on a potential at a connection node between the first ferroelectric capacitor and the second ferroelectric capacitor when the potential difference is given to the memory cell; and wherein the memory cell selection section includes a first switch that is provided between the potential difference generation section and the one end of the memory cell, a second switch that is provided between the potential difference generation section and the other end of the memory cell, a third switch that is provided between the judging section and the connection node, and a word line that is electrically connected to the first switch, the second switch and the third switch, for controlling the first switch, the second switch and the third switch.

2. A ferroelectric memory device according to claim 1, further comprising a first data line that electrically connects the potential difference generation section and the one end of the memory cell, a second data line that electrically connects the potential difference generation section and the other end of the memory cell, a bit line that electrically connects the judging section and the connection node, and a charge section that charges the first data line, the second data line, and the bit line to a specified potential.

3. A ferroelectric memory device according to claim 1, wherein the judging section judges the memory data by comparing a potential in a middle of the potential difference and a potential at the connection node.

4. A ferroelectric memory device according to claim 1, wherein the judging section has an inverter that receives the potential at the connection node as an input.

5. A ferroelectric memory device according to claim 1, further comprising a writing section that re-stores the memory data in the memory cell, by controlling the potentials on the both ends of the memory cell and the connection node, based on the memory data judged by the judging section.

6. A ferroelectric memory device according to claim 5, wherein the writing section has:

a first inverter that receives the potential at the connection node as an input, and supplies an output to both ends of the memory cell, and a second inverter that inverts the output of the first inverter, and supplies the output to the input of the first inverter.

7. A ferroelectric memory device according to claim 6, wherein the writing section is further equipped with a switch provided between the first inverter and both ends of the memory cell.

8. A ferroelectric memory device according to claim 1, further comprising a latch circuit that latches the memory data that the judging section has judged.

9. An electronic apparatus comprising the ferroelectric memory device recited in claim 1.

10. A driving method for driving a ferroelectric memory device having a plurality of memory cells each having a first ferroelectric capacitor and a second ferroelectric capacitor that are connected to each other in series, the driving method comprising:

a step of selecting a specified one of the plurality of memory cells;

a step of giving a potential difference across one end and another end of the memory cell;

a step of judging memory data stored in the memory cell based on a potential at a connection node between the first ferroelectric capacitor and the second ferroelectric capacitor when the potential difference is given to the memory cell; and wherein the step of selecting the memory cell includes providing a first switch electrically coupled to the one end of the memory cell, providing a second switch electrically coupled to the another end of the memory cell, providinci a third switch electrically coupled to the connection node, and providing a word line that is electrically connected to the first switch, the second switch, and the third switch, for controlling the first switch, the second switch and the third switch.

11. A driving method according to claim 10, further comprising a step of re-storing the memory data in the memory cell, by controlling the potentials on both ends of the memory cell and the connection node, based on the memory data judged by a judging section.

* * * * *